United States Patent [19]

McGinn

[11] Patent Number: 4,636,794

[45] Date of Patent: Jan. 13, 1987

[54] PHOTO-CONDUCTIVE ELEMENT OPERATIVE IN THE MICROWAVE REGION AND A LIGHT-STEERABLE ANTENNA ARRAY INCORPORATING THE PHOTO-CONDUCTIVE ELEMENT

[76] Inventor: Vincent P. McGinn, 1952 N. Oak La., State College, Pa. 16803

[21] Appl. No.: 634,593

[22] Filed: Jul. 26, 1984

[51] Int. Cl.⁴ ........................ H01Q 3/30; H01L 31/08; H01P 7/06

[52] U.S. Cl. ........................ 342/368; 338/15; 333/231

[58] Field of Search .................... 343/368; 338/15-19; 250/578; 333/227, 231, 235, 164, 219, 202; 357/30

[56] References Cited

U.S. PATENT DOCUMENTS

| | | | |
|---|---|---|---|
| 3,443,103 | 5/1969 | Lakshmanan | 338/15 |
| 3,649,855 | 3/1972 | Auld | 333/235 |
| 3,836,712 | 9/1974 | Kornreich et al. | 338/15 |
| 3,878,105 | 4/1975 | Palmer | 357/30 |
| 4,282,499 | 8/1981 | De Fonzo | 333/231 |
| 4,423,403 | 12/1983 | Miyake et al. | 338/15 |
| 4,462,019 | 7/1984 | Ewaldt et al. | 338/15 |
| 4,490,709 | 12/1984 | Hammond et al. | 338/15 |
| 4,561,119 | 12/1985 | Epworth | 455/609 |

*Primary Examiner*—Theodore M. Blum
*Assistant Examiner*—David Cain
*Attorney, Agent, or Firm*—Erwin S. Teltscher; Peter R. Ruzek

[57] ABSTRACT

A steerable microwave antenna array having directional characteristics, which includes at least two antenna elements spaced from one another by a predetermined distance, each antenna element defining a controllable directional radiation pattern of a selectable intensity, and having an axis of maximum radiation intensity, and wherein the directional characteristics are derived from the super-position of the radiation patterns, the axes subtending a predetermined angle therebetween, the wherein the improvement provides for feed means connected to each antenna element, each including a photo-conductive element for a selected frequency in the microwave region, so that, upon the photoelectric elements being impinged with a selected intensity of light, the directional characteristics are changed in dependence of at least the difference in the intensity of light impinging on the photo-conductive elements, respectively.

15 Claims, 7 Drawing Figures

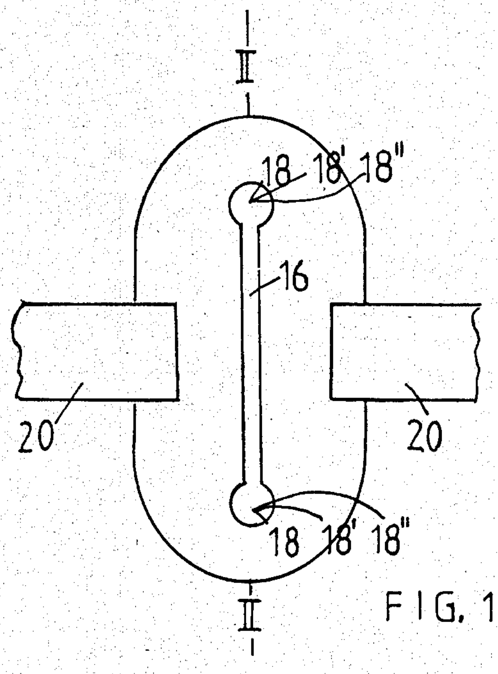
FIG. 1
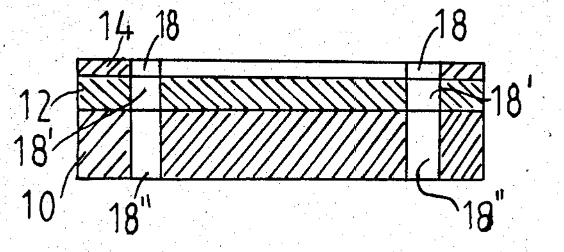
FIG. 2
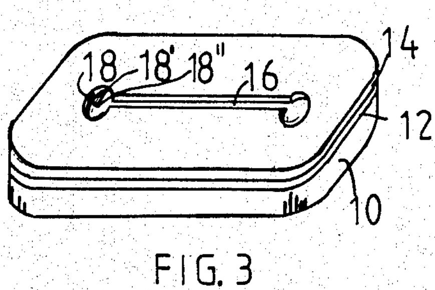
FIG. 3
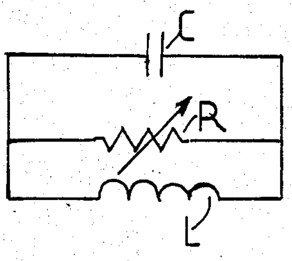
FIG. 4
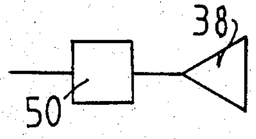
FIG. 7
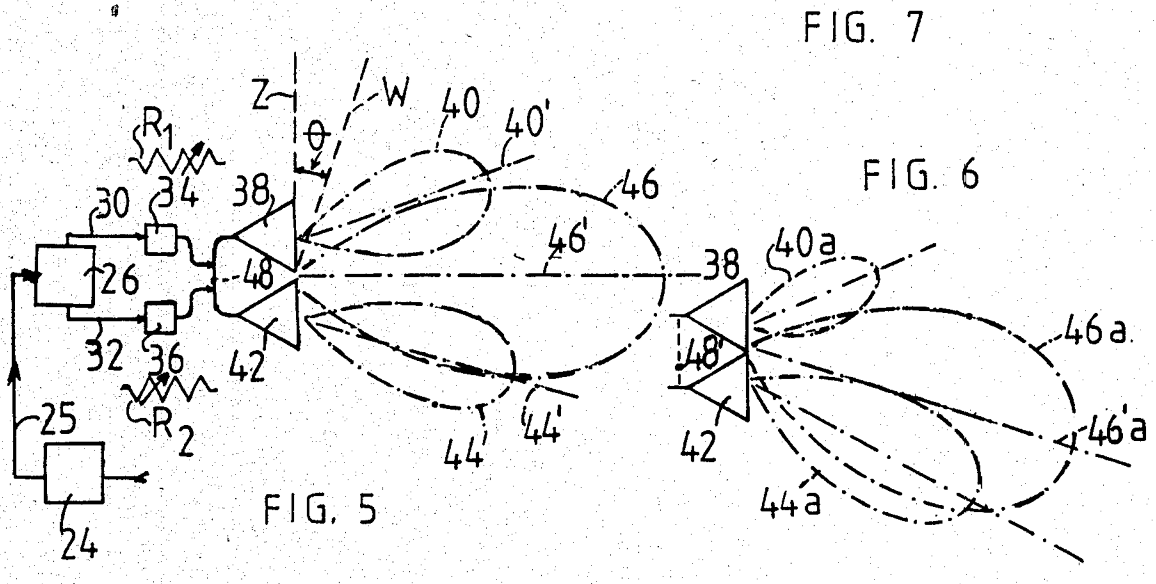
FIG. 5
FIG. 6

PHOTO-CONDUCTIVE ELEMENT OPERATIVE IN THE MICROWAVE REGION AND A LIGHT-STEERABLE ANTENNA ARRAY INCORPORATING THE PHOTO-CONDUCTIVE ELEMENT

BACKGROUND OF THE INVENTION

Photo-conductive elements have been known for some time—see, for example, "Electronic Devices and Circuits" by Jacob Millman and Christos C. Halkias, McGraw Hill Book Company, 1966. Other articles or publications dealing with photo-conductive elements are, for example, Photocell design theory and application, from "Photoconductive Cell Applications Design Handbook" Clairex Electronics, 1978, Vactec Inc., Bulletin PCD-6, 1970, "Electrooptics Information Sheet, CdS CDSe Photoconductive cells" Centronic Inc. 1101 Bristol road, Mountainside N.J. 07092, and from RCA Transistor and Thyristor Diode Manual, RCA, 1969. Information on lumped circuit elements (LE) can be obtained, for example, from "Advances in Microwaves" Edited by Leo Young, Academic Press, Vol. 8, New York, N.Y, while information on conventionally constructed directive antenna arrays can be obtained, for example, from the book "Antenna Theory and Design" by Warren L. Stutzman, and Gary A. Thiele, John Wiley & Sons.

When light falls on the photo-conductive element, generally a semiconductor material, its resistance decreases, so that its electrical conductivity increases. The fact that this phenomenon relies on a bulk effect means that no PN junction is required for its operation. Many semiconductor materials suitable for use in the photo-conductive element permit a change in resistivity extending over about 5 orders of magnitude.

If a photo-conductive material of this type were to be placed in the channel of a coplanar microwave capacitor, alterations in the real component of the capacitor's impedance could be obtained. However, a difficulty arises due to the fact that at microwave frequencies, for example of the order of 10 GHz, the capacitive reactance $X_c$ of the coplanar capacitor is much lower than the lowest resistance R offered by the photo-conductive element. Thus, although the real component R of the impedance of the coplanar microwave capacitor can be made to vary over the aforecited relatively large range, this variation is masked by the low value of capacitive reactance $X_c$ in parallel with the resistance R. Due to the aforecited masking it has not been possible hitherto to use a photo-conductive element at microwave frequencies for controlling applications at such frequencies.

SUMMARY OF THE INVENTION

It is an object of the present invention to obviate such disadvantages, and in particular to devise a photo-conductive element suitable for being used at microwave frequencies where its resistance change due to varying light illumination is not masked out by the capacitance in the microwave component, such as, for example, a coplanar microwave capacitor.

It is another object of the present invention to use the photo-conductive element, according to the present invention, in a light-controlled steerable microwave antenna array.

The first object is attained by constructing the photoelectric element, according to the present invention, so as to include in the photo-conductive element a dielectric substrate, a layer of photo-conductive material disposed on the substrate, and a layer of conductive material disposed on the layer of photoconductive material, which photo-conductive layer is formed with an opening having the electrical characteristics of a resonant circuit at a selected frequency in the microwave region.

The second object is attained by a steerable microwave antenna array having directional characteristics, which includes at least two antenna elements spaced from one another by a predetermied distance, each antenna element defining a controllable directional radiation pattern of a selectable intensity, and having an axis of maximum radiation intensity, and wherein the directional characteristics are derived from the superposition of the radiation patterns, the axes subtending a predetermined angle therebetween, and wherein the improvement provides for feed means connected to each antenna element, each including a photo-conductive element for a selected frequency in the microwave region, so that, upon the photo-electric elements being impinged with a selected intensity of light, the directional characteristics are changed in dependence of at least the difference in the intensity of light impinging on the photoconductive elements, respectively.

Other objects will became apparent thereafter from the drawings, the description of the preferred embodiments, and the dependent claims set forth hereinafter.

BRIEF DESCRIPTION OF THE DRAWINGS

For a fuller understanding of the nature and objects of the present invention, reference should be had to the following detailed description, taken in connection with the accompanying drawings, in which:

FIG. 1 is a plan view of the photo-conductive element, according to the present invention, FIG. 2 is a cross-section along the line II—II of FIG. 1, FIG. 3 is a perspective view of the photo-conductive element, according to the present invention, FIG. 4 is a circuit diagram of the equivalent electric circuit of the photo-conductive element, according to the present invention, FIG. 5 is a block schematic diagram of a steerable microwave antenna array incorporating the photo-conductive element, according to the present invention, and showing its directional characteristics when the photo-conductive elements incorporated therein are illuminated at approximately equal light intensities, and where sidelobes are omitted for clarity's sake, FIG. 6 is a block schematic diagram corresponding to that of FIG. 5, but showing the directional characteristics of the antenna array, when the photo-conductive elements are illuminated at different respective light intensities, with the side lobes again being omitted for clarity's sake; and FIG. 7 is an alternate embodiment of a detail of FIG. 6.

DESCRIPTION OF THE PREFERRED EMBODIMENTS

Referring now to the drawings, and in particular to FIGS. 1, 2 and 3, on an insulating dielectric substrate 10 which may, for example, be alumina, quartz, teflon, or glass epoxy, there is disposed a layer of "bulk effect" photo-conductive material 12, which may, for example, be cadmium selenide, cadmium sulfide, zinc oxide, cadmium sulfoselenide, mercury doped germanium, silicon, or chromium arsenide. A layer of conductive material 14, for example, of indium, is in turn disposed on the photoconductive layer 12; the material of the conductive layer is selected so that it can be easily bonded to the photo-conductive material 12 chosen. The layer of conductive material 12 is formed with an elongated slot 16, which communicates with two apertures 18 near the respective ends of the slot 16. The slot 16 may typically have a width of about 0.2 mm, while each aperture may typically be substantially circular in shape, and have a diameter of about 0.4 mm. In a preferred embodiment the photoconductive layer 12 is formed with holes 18', which are superimposed onto the apertures 18, respectively, and also substantially match the dimensions of the apertures 18. Furthermore, the dielectric substrate 10 may additionally be formed with holes 18", which, in turn, are superimposed onto the apertures 18 and the holes 18', respectively. In this manner the photo-conductive element can be assembled in a first manufacturing operation, and bores can be drilled therethrough in a second operation, resulting in the formation of the apertures 18 and the holes 18' and 18". Connections 20, which are bonded to the conductive material 14 lead to a (non-illustrated) source of microwave energy at the selected frequency $f_c$. Such a frequency may lie, for example, within a range from about 5 GHz to about 120 GHz.

The equivalent electric circuit of the configuration illustrated in FIGS. 1, 2 and 3 is shown in FIG. 4, being a parallel resonant circuit, consisting of lumped circuit elements (LE) in the form of a capacitor C, and inductor L, and a variable resistor R. The slot 16 in parallel with the slit 16' represents the capacitative reactance $-jX_c$, while the conductive loops bordering the apertures 18 and/or holes 18' represent the inductive reactance $+jX_c$ connected in parallel with the capacitative reactance $-jX_c$. The inductive reactance $+jX_c$ is selected so as to yield a resonant circuit at the selected microwave frequency $f_o$.

The photo-conductive element, according to the present invention, can be embodied into a number of electric circuits, of which a steerable microwave antenna array will be illustrated by way of an example.

Thus in FIG. 5 there will be seen a steerable microwave array 22, which is made up of a radio-frequency source 24 producing energy at the frequency $f_o$, a line 25 feeding the radio frequency energy to a power splitter 26, which, in turn feeds two lines 30 and 32 connected to respective photo-conductive elements 34 and 36. Photo-conductive element 34 is connected to an antenna element 38 having a directive radiation pattern 40 shown in dotted lines, and having a main axis 40', while the photo-conductive element 36 is connected to an antenna element 42, having a directive radiation pattern 44, also shown in dotted lines, and having a main axis 44'. The line 30 and the photo-conductive element 34, electrically represented by a variable resistor $R_1$, can be considered as feed means for the antenna element 38, while the line 32 and the photo-conductive element 36, represented by a variable resistor $R_2$, can be considered as feed means for the antenna element 42. The phase of the radiation patterns 40 and 44 is adjusted, so that their superposition normally results in a constructive interference, namely the two radiation patterns 40 and 44 are added into a combined radiation pattern 46, shown in dash-dotted lines. Such a pattern results when the photo-conductive elements 34 and 36 are illuminated at equal light intensities, and therefore have equal resistivities. The radiation pattern 46 will be seen to have maximum intensity along a line 46' equiangularly spaced from the main axes 40' and 44' of maximum intensity of the radiation patterns 40 and 44, respectively. As schematically illustrated in FIG. 5, the antenna array 22 can then be considered as being fed from a "central feed point" 48.

When the photo-conductive elements 34 and 36 are, however, illuminated at unequal light intensities, then, for the case, for example, when photo-conductive element 34 is illuminated at a lower light intensity, and photo-conductive element 36 is illuminated at a higher light intensity, the resulting radiation pattern **40*a* shown in FIG. 6 will be attenuated compared to the radiation pattern 40 shown in FIG. 5, while the radiation pattern 44*a* shown in FIG. 6 will be more intense than the corresponding radiation pattern 44 shown in FIG. 5. Consequently a radiation pattern 46*a* as shown in FIG. 6 will result due to the superposition of the radiation patterns 40*a* and 44*a*, whose main axis 46*a*' will, for example, form a positive predetermined angle (pointing downwards) with the main axis 46' of the radiation pattern of FIG. 5, which angle may, for example, be an acute angle. Conversely, if the photo-conductive element 34 is illuminated at a greater light intensity than the photo-conductive element 36, the main axis 46*a*' of the resulting radiation pattern will form a negative predetermined angle with the main axis 46' of the radiation pattern of FIG. 5, and point upwards, which angle may also be an acute angle. In this case the "apparent feed point" 48' shown in FIG. 6 is displaced with respect to the "apparent center feed point 48" shown in FIG. 5**.

In FIG. 7 there is shown an alternate embodiment of the light-steerable antenna array; an amplitude-to-phase converter 50 is incorporated into the feed means, and feeds at least one antenna element 38, as shown. Of course, separate amplitude-to-phase converters can be provided for each antenna element.

A microwave antenna array can also be steered by varying the phase shift between two antenna elements. Thus by using the photo-electric element according to the present invention in conjunction with conventional amplitude-to-phase conversion means, the antenna array can alternatively be steered by light-intensity, by using the variable phase shift technique. Amplitude-to-phase conversion has been used, for example, by Major Edwin Armstrong in one of his first FM transmitters.

For the purpose of understanding the phase shift technique, as used in conjunction with the inventive photo-conductive element, and referring to FIG. 5, let an angle $\theta$ be defined between an upward-pointing axis z and a line w. Let $\alpha$ be an electrical phase shift introduced between the antenna elements 38 and 42, and let a distance d be the antenna element to antenna element spacing in terms of a fraction of the wavelength of the radiation frequency used; this spacing will, for convenience's sake, be assumed to be an odd multiple of one half of the wavelength. Also, for convenience, let an angle $\alpha$ be defined as $\alpha=\beta d\cos\theta_o$, where $\lambda$ is the wavelength of the radiation frequency.

Then from equation 3-36 of the "Antenna Theory and Design" book:

$\alpha$=electrical phase shift between elements $\beta=2\pi/\lambda$ d=element-to-element spacing in terms of wavelength taken here as $1.5\lambda$ $\theta_o$=steering angle.

Thus $\alpha=(-)(2\pi/\lambda)1.5\lambda\cos\theta_o$, or $\alpha=-3\pi\cos\theta_o$.

Clearly, if $\alpha=0$ degrees, then $\cos\theta_o=0$, or $\theta_o=90°$.

This means that the main beam is directed straight ahead along the axis 46', as shown in FIG. 5.

It can be shown that if $\alpha$ is selected to be an odd multiple of 90° then a steering angle of ±9.594° can be obtained, which is more than adequate for commercial applications of automobile radar, for example.

I wish it to be understood that I do not desire to be limited to the exact details of construction shown and described, for obvious modifications will occur to a person skilled in the art.

Having thus described the invention, what I claim as new and desire to be secured by Letters Patent is as follows:

1. A photo-conductive element for a selected frequency in the microwave region, comprising in combination, a dielectric substrate, a layer of photo-conductive material disposed on the substrate, and a monolithic layer of conductive material disposed on said layer of photo-conductive material, said layer of conductive material being formed with an opening having the electrical characteristics of a resonant circuit at said frequency.

2. The photo-conductive element as claimed in claim 1, wherein said opening is formed as an elongated slot of a predetermined width having the electrical characteristics of a capacitor, and wherein two apertures are formed in said layer of photo-conductive material near each end of said slot, said apertures communicating with said slot, each aperture having the electrical characteristics of an inductor.

3. The photo-conductive element as claimed in claim 2, wherein two holes are formed in said layer of photo-conductive material, said holes communicating with said said apertures, respectively.

4. The photo-conductive element as claimed in claim 3, wherein two holes are formed in said dielectric substrate, said two holes in said dielectric substrate communicating with said two holes in said photoconductive material, respectively.

5. The photo-conductive element as claimed in claim 4, wherein each aperture has a predetermined area, and each hole has a prearranged area, said predetermined areas corresponding to said prearranged areas, respectively.

6. The photo-conductive element as claimed in claim 5, wherein each aperture has a substantially circular shape, and has a diameter corresponding to about twice the width of said slot.

7. The photo-conductive element as claimed in claim 6, wherein the diameter of each aperture is about 0.4 mm, and the width of said slot is about 0.2 mm.

8. The photo-conductive element as claimed in claim 1, wherein said photo-conductive material is selected from the group consisting of cadmium selenide, cadmium sulfide, zinc oxide, cadmium sulfoselenide, mercury-doped germanium, silicon, and chromium-gallium arsenide.

9. The photo-electric element as claimed in claim 1, wherein said dielectric substrate is selected from the group consisting of alumina, quartz, teflon, and glass epoxy.

10. The photo-conductive element as claimed in claim 1, wherein said layer of conductive material includes indium.

11. In a steerable microwave antenna array having directional characteristics, and including at least two antenna elements spaced from one another by a predetermined distance, each antenna element defining a controllable directional radiation pattern of a selectable intensity, and having an axis of maximum radiation intensity, said directional characteristics being derived from the superposition of said radiation patterns, said axes subtending a predetermined angle therebetween, the improvement comprising feed means connected to each antenna element, each including a photo-conductive element for a selected frequency in the microwave region, so that, upon said photoconductive elements being impinged with a selected intensity of light, respectively, said directional characteristics are changed in dependence of at least the difference in the intensity of light impinging on said photo-conductive elements, respectively.

12. The steerable microwave antenna array as claimed in claim 11, wherein each photo-electric element includes a dielectric substrate, a layer of photo-conductive material disposed on the substrate, and a layer of conductive material disposed on said layer of photo-conductive material, and being formed with an opening having the electrical characteristics of a resonant circuit at said frequency.

13. The steerable microwave antenna array as claimed in claim 11, wherein said predetermined angle is an acute angle.

14. The steerable microwave antenna array as claimed in claim 11, wherein at least one of said feed means includes amplitude-to-phase conversion means.

15. A photo-conductive element for a selected frequency in the microwave region, comprising in combination, a dielectric substrate, a layer of photo-conductive material disposed on the substrate, and a layer of conductive material disposed on said layer of photo-conductive material, said layer of conductive material having an opening in the form of an elongated slot of predetermined width, which has the electrical characteristics of a capacitor, two apertures being formed in said layer of photo-conductive material near each end of said slot, said apertures communicating with said slot, each aperture having the electrical characteristics of an inductor.

* * * * *